United States Patent
Sinclair et al.

(10) Patent No.: US 8,841,631 B1
(45) Date of Patent: Sep. 23, 2014

(54) APPARATUS AND TECHNIQUES FOR CONTROLLING ION ANGULAR SPREAD

(71) Applicant: Varian Semiconductor Equipment Associates, Inc., Gloucester, MA (US)

(72) Inventors: Frank Sinclair, Boston, MA (US); Joseph C. Olson, Beverly, MA (US); Edward W. Bell, Newbury, MA (US); Danielle Feldman, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/221,866

(22) Filed: Mar. 21, 2014

Related U.S. Application Data (60) Provisional application No. 61/839,516, filed on Jun. 26, 2013.

(51) Int. Cl.
  *H01J 37/16* (2006.01)
  *H01J 37/153* (2006.01)
  *H01J 37/30* (2006.01)
  *H01J 37/317* (2006.01)
  *H01J 37/147* (2006.01)

(52) U.S. Cl.
  CPC ......... *H01J 37/1477* (2013.01); *H01J 37/3007* (2013.01); *H01J 37/3171* (2013.01)
  USPC ............... 250/396 R; 250/492.21; 250/492.3; 250/396 ML; 250/397; 250/398

(58) Field of Classification Search
  CPC ....... H01J 37/16; H01J 37/304; H01J 37/153; H01J 37/1477; H01J 37/12; H01J 37/08; H01J 37/05; H01J 37/04; H01J 37/1472; H01J 37/141; H01J 37/3171; H01J 49/282; H01J 49/40; H01J 49/4245
  USPC ......... 250/492.21, 311, 310, 396 R, 396 ML, 250/492.3, 307, 442.11, 492.2, 251, 282, 250/287, 294, 298, 300, 305, 398, 492.1
  See application file for complete search history.

(56) References Cited

U.S. PATENT DOCUMENTS

| | | | | |
|---|---|---|---|---|
| 6,677,592 | B2 * | 1/2004 | Chen | 250/396 R |
| 6,855,939 | B2 * | 2/2005 | Rose et al. | 250/396 R |
| 7,348,576 | B2 * | 3/2008 | Gupta et al. | 250/492.21 |
| 7,394,078 | B2 * | 7/2008 | Gupta et al. | 250/492.21 |
| 7,579,605 | B2 * | 8/2009 | Renau et al. | 250/492.21 |
| 7,800,082 | B2 * | 9/2010 | Kellerman et al. | 250/492.21 |
| 8,309,936 | B2 * | 11/2012 | Kreckel et al. | 250/396 R |
| 8,330,127 | B2 * | 12/2012 | Low et al. | 250/492.21 |
| 2005/0263715 | A1 * | 12/2005 | Nakasuji et al. | 250/396 ML |
| 2013/0068942 | A1 * | 3/2013 | Verenchikov | 250/282 |

\* cited by examiner

*Primary Examiner* — David A Vanore (57) ABSTRACT

An electrostatic scanner to scan an ion beam in an ion implanter. The electrostatic scanner may include a first scan plate having a first inner surface that faces the ion beam, the first inner surface having a concave shape in a first plane that is perpendicular to a direction of propagation of the ion beam, and a second scan plate opposite the first scan plate separated by a gap to accept the ion beam the second scan plate having a second inner surface that faces the ion beam and a convex shape in the first plane, the first scan plate and second scan plate configured to generate an electrostatic field in the gap to scan the ion beam back and forth along a horizontal direction perpendicular to the direction of propagation of the ion beam.

17 Claims, 8 Drawing Sheets

APPARATUS AND TECHNIQUES FOR CONTROLLING ION ANGULAR SPREAD

RELATED APPLICATIONS

This application claims priority to U.S. Provisional Patent application No. 61/839,516 filed Jun. 26, 2013.

FIELD

The present embodiments relate to an ion implantation apparatus, more particularly, to beam angle uniformity control in ion implantation apparatus.

BACKGROUND

Present day manufacturing for semiconductor electronics, solar cells, and other technology relies on ion implanter systems for doping or otherwise modifying silicon and other types of substrates. One type of ion implanter system performs the doping by generating an ion beam and directing it toward a substrate so that the ions come to rest beneath the substrate surface. In many applications, ion beams having a defined shape and ion beam area such as a spot beam or ribbon beam are scanned over a substrate to implant a species into a substrate area that is larger than the ion beam area. The substrate may be scanned with respect to a stationary beam or both substrate and beam may be scanned with respect to one another. In any of these circumstances many applications require that a substrate be implanted uniformly over a large portion of the substrate. Unfortunately, certain non-uniformities may result during the implant process.

Certain non-uniformities may be produced by the ion beam during the implant process. One type of non-uniformity is the spread of angles of incidence of a nominally parallel ion beam. In some cases this spread of angles of incidence may track systematically across a substrate such that the angle of incidence toward one side is different than that toward another side. Beamline ion implantation apparatus often treat an ion beam by shaping, deflecting, accelerating, and decelerating ions through various components over the beam path. In many systems, even after "collimation" of an ion beam at final stages before incidence on a substrate, the vertical angle spread of ions across a substrate may be, for example, between about 0.5 to 1.0°. Even small differences in angles of incidence may have large effects on implant process uniformity. It is with respect to these and other considerations that the present improvements have been needed.

BRIEF SUMMARY

In one embodiment, an electrostatic scanner to scan an ion beam in an ion implanter. The electrostatic scanner may include a first scan plate having a first inner surface that faces the ion beam, the first inner surface having a concave shape in a first plane that is perpendicular to a direction of propagation of the ion beam, and a second scan plate opposite the first scan plate separated by a gap to accept the ion beam the second scan plate having a second inner surface that faces the ion beam and a convex shape in the first plane, the first scan plate and second scan plate configured to generate an electrostatic field in the gap to scan the ion beam back and forth along a horizontal direction perpendicular to the direction of propagation of the ion beam.

In a further embodiment, an ion implantation system includes an electrostatic scanner to scan an ion beam that includes a first scan plate and a second scan plate opposite the first scan plate. The first scan plate and second scan plate may be separated by a gap to conduct the ion beam therethrough, and configured to generate an electrostatic field therebetween. The ion implantation system also includes a magnetic collimator operative to bend the scanned ion beam in a curve within a first plane, wherein the curve comprises an outer curve portion and an inner curve portion, and wherein the first scan plate and second scan plate are interoperative to generate variable vertical focusing of the ion beam along a vertical direction that is perpendicular to the first plane, wherein vertical focusing is more divergent along the outer curve portion than the inner curve portion.

In a further embodiment, a method for processing an ion beam includes directing the ion beam between a first scan plate having a concave curvature on an inner surface facing the ion beam and a second scan plate having a convex curvature on an inner surface facing the ion beam and the first scan plate, the concave curvature and convex curvature lying in a first plane. The method may further include scanning the ion beam back and forth using a fluctuating electric field between the first scan plate and second scan plate in a horizontal direction perpendicular to a direction of propagation of the ion beam.

DETAILED DESCRIPTION

The embodiments described herein provide apparatus and methods for controlling an ion beam in an ion implantation system. Examples of an ion implantation system include a beamline ion implantation system. The ion implantation systems covered by the present-embodiments include those that generate "spot ion beams" that have a cross-section that has the general shape of a spot. In the present embodiments, a novel deflection system is provided to adjust beam properties of an ion beam passing therethrough. The novel deflection system in particular may form part of an electrostatic scanner and may be used to scan and shape the beam in a manner that compensates for nonuniformities induced by other beamline components. In various embodiments, as detailed below a set of curved electrostatic plate pairs is used in conjunction with a beam collimator such as a magnetic collimator to reduce non-uniformity in vertical angle spread of an ion beam as it is scanned across a substrate.

The electrostatic scanner of the present embodiments may in particular be used with conventional magnetic collimators to reduce the vertical ion beam angle spread and non-uniformity in vertical ion beam angle spread across a substrate that is introduced in conventional ion implantation systems after ions travel through the magnetic collimator. This particular non-uniformity results from the fact that in many conventional ion implanters, the geometry of the collimator magnet component is such that the collimator magnet bends the outer curve trajectories of ions by a larger deflection angle than the inner curve trajectories. This results in more focusing of ions in portions of the ion beam proximate the outer curves, and results in a more convergent ion beam or less divergent (depending on the nature of the particular beam) ion beam reaching the substrate at those portions. In one example of present day ion implantation apparatus, an almost parallel beam may be produced towards a side of a substrate exposed to an "outer curve" portion of the ion beam, while a divergent beam strikes the substrate at a side exposed to the "inner curve" portion of the ion beam, resulting in a vertical angle spread ranging from close to zero degrees (<~0.1°) to between 0.5° and 1° at various locations across a substrate in one example.

Figure 1A:
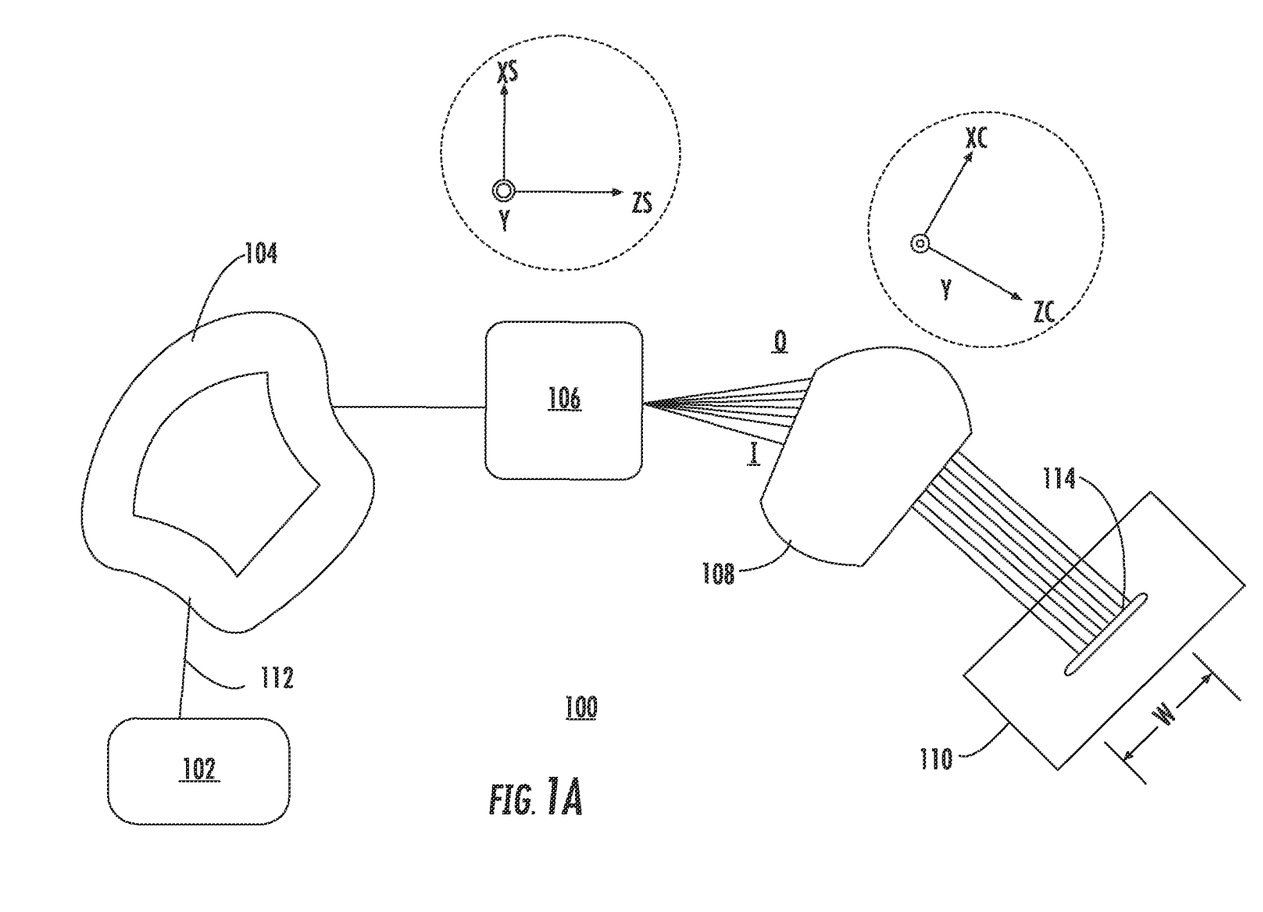
FIG. 1A presents a top view in block diagram form of an exemplary beamline ion implantation apparatus.
Figure 1B:
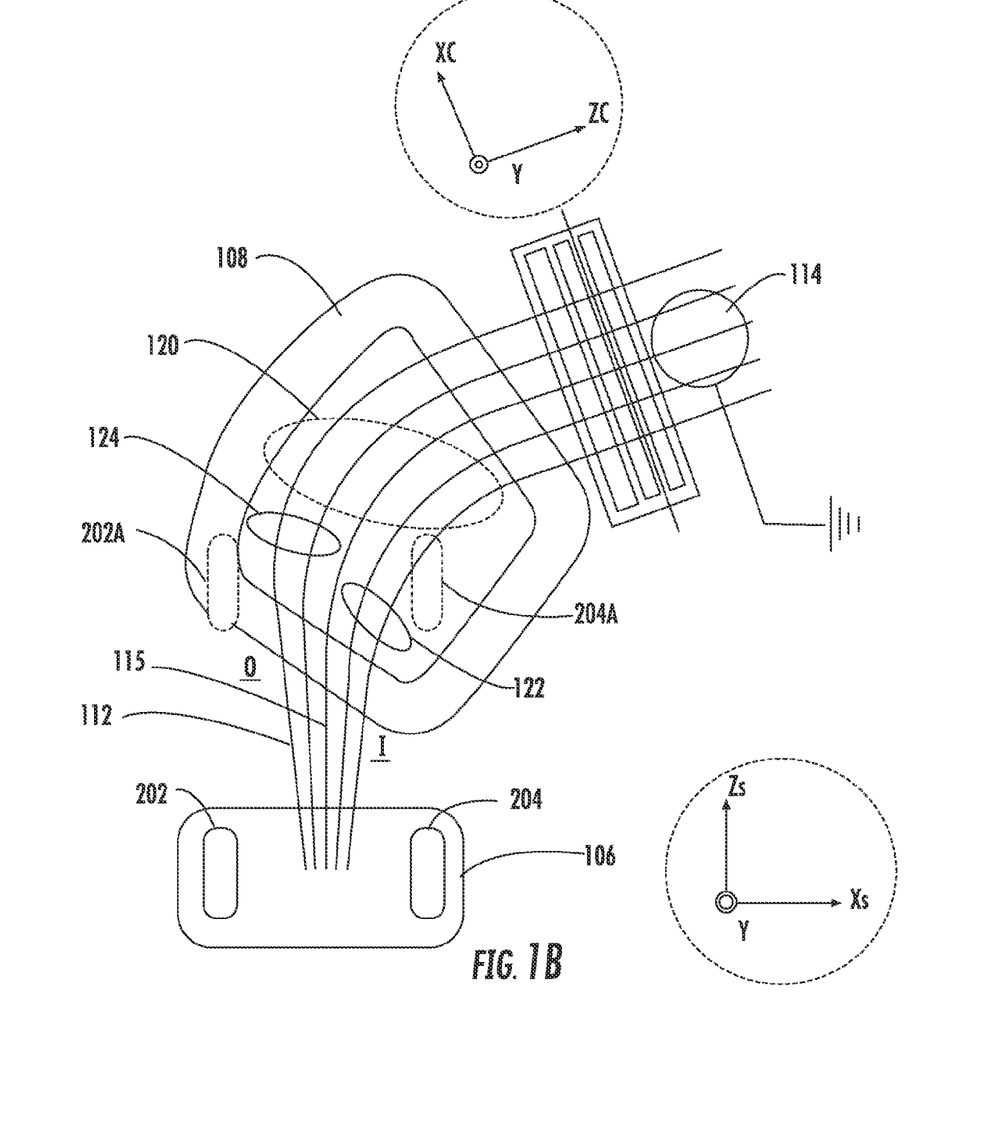
FIG. 1B depicts a top view of the apparatus of FIG. 1A showing details of select components.

FIG. 1A presents a top view that depicts general features of an ion implantation apparatus 100, while FIG. 1B depicts a top view showing details of select components of the ion implantation apparatus 100 consistent with the present embodiments. The various elements of the ion implantation apparatus 100 include an ion source 102, analyzing magnet 104, electrostatic scanner 106, magnetic collimator 108, and substrate stage 110. The ion implantation apparatus 100 is configured to generate an ion beam 112 and deliver the ion beam 112 to a substrate 114. The particular configuration illustrated in FIG. 1A may be particularly suited for medium current ion implantation. However, the embodiments are not limited in this context. The operation of various components of the ion implantation apparatus 100, including ion source 102, analyzing magnet 104, mass analysis slit (not separately shown) and substrate stage 110 are well known and further discussion of such components is omitted herein.

As illustrated in FIG. 1A the ion beam 112 is directed along a path in which the direction of propagation changes between ion source 102 and substrate stage 110. For convenience in the discussion to follow, different coordinate systems are employed to describe operation of the present embodiments as shown. At the electrostatic scanner, a first Cartesian coordinate system whose components are labeled Y, Xs, and Zs, are used, while at the exit of the magnetic collimator 108 a second Cartesian coordinate system whose components are labeled Y, Xc, and Zc, are used. In each coordinate system, the Y-direction is the same absolute direction. The Z-direction for the different coordinate systems is in each case along the direction of ion beam propagation at a particular point. Thus, the absolute direction Zc differs from Zs. Similarly Xc differs from Xs. However, Xc and Zc define an "X-Z" plane that may be common to that plane defined by Xs and Zs.

The ion implantation apparatus 100, like conventional apparatus, bends the ion beam 112 along an arc within the magnetic collimator 108. In this case, the ion beam 112 is bent within an arc that lies in the X-Z plane, where the X-Z plane is perpendicular to the Y-direction. In the figures, the ion beam 112 is shown as curving toward the right as the ion beam 112 propagates toward the substrate 114 in the top view of FIG. 1A. As detailed below, and consistent with conventional ion implantation apparatus, the magnetic collimator 108 is configured such that ion beam focusing differs on the outside of the arc of ion beam 112 at outer curve position O, in comparison to the ion beam focusing at the inside of the arc of ion beam 112 at inner curve position I. This is due to the arrangement of the constituent components of the magnetic collimator 108 which are not individually pictured. Such a conventional magnetic collimator arrangement provides advantages in simplicity and compactness of design. However, the variable focusing generated by the magnetic collimator 108 translates into variable focusing applied to the ion beam 112 along the Xc direction as it propagates to the substrate 114. In particular what is termed herein "vertical focusing" of the ion beam 112 varies between the outer curve point O and inner curve point I. The vertical focusing denotes focusing of the ion beam with respect to the Y direction, which is orthogonal to the X-Z plane, as noted. The related term "vertical angle spread" refers to the range of angles for ion trajectories with respect to the Xc-Zc plane, which is perpendicular to the Y-direction. For example, ions at outer curve position O may have parallel trajectories that are all orthogonal to the Y-direction and lie parallel to the Xc-Zc plane, in which case the vertical angle spread is zero. The ion trajectories at inner curve position I may on the other hand vary over a range of angles up to about one degree with respect to the Xc-Zc plane, in which case the vertical angle spread is said to be one degree.

In the present embodiments, an electrostatic scanner such as the electrostatic scanner 106 includes novel deflection plates or "scan plates" that are configured to reduce variable focusing produced in the ion beam. As shown below, the design of scan plates in particular is arranged to compensate for variable focusing induced by an element such as the collimator magnet. This increases the overall uniformity of an implantation process and results in better uniformity across a substrate for those substrate properties that are affected by angular variation of ion trajectories in an ion implantation process.

Turning to FIG. 1B there are shown details of the ion implantation apparatus 100 that illustrate the interrelation of scan plates and collimator magnet consistent with the present embodiments. In order to compensate for the variable focusing of a magnetic collimator such as magnetic collimator 108, an electrostatic scanner such as the electrostatic scanner 106 is configured with scan plates having a non-linear shape in the Xs-Y plane (shown in FIGS. 3A-3B and 4-5 to follow). This has the effect of adjusting the effective focal length of ions across positions along the Xs (and Xc) direction, resulting in reduced vertical angle spread. Because an ion beam may enter the electrostatic scanner as a tall (along the Y direction) and narrow (along the Xs direction) ion beam, control of vertical uniformity afforded by the present embodiments may be more important than control of horizontal uniformity.

As illustrated in FIG. 1B, an ion beam 112 passes through the electrostatic scanner 106, which includes a concave scanner portion 202 and convex scanner portion 204 that are disposed on opposite sides of the ion beam 112 and provide a gap for the ion beam 112 to pass through. The concave scanner portion 202 and convex scanner portion 204 are shown schematically without details in FIG. 1B. However, FIGS. 3A-3D discussed below illustrate exemplary details of the concave scanner portion 202 and convex scanner portion 204. In various embodiments, detailed in FIGS. 3A-3D, the concave scanner portion 202 and convex scanner portion 204 may each include one or more scan plates such that each scan plate of concave scanner portion 202 is paired with a scan plate of convex scanner portion 204. In particular, the concave scanner portion 202 present a concave surface facing the ion beam 112 (within the Xs-Y plane, shown in the figures to follow) while the convex scanner portion 204 presents a convex surface facing the ion beam. This has the effect of increasing vertical divergence of ion trajectories for ions located near the concave scanner portion 202 and decreasing vertical divergence of ion trajectories of ions located near the convex scanner portion 204.

As further shown in FIG. 1B, the ion beam 112, such as a central ray trajectory 115, exits the electrostatic scanner 106 where the central ray trajectory 115 defines the $Z_S$ direction. However, due to the effect of electrostatic scanning those ions closer to concave scanner portion 202 may diverge to the left from the perspective of FIG. 1B, and those ions closer while closer to the convex scanner portion 204 diverge toward the right. This causes the ion beam 112 to fan out as it approaches the magnetic collimator 108, although the average direction of propagation of the ion beam may lie parallel the $Z_S$ direction.

As the ion beam 112 enters the magnetic collimator 108, the ion beam 112 is bent along the arc 120, which includes multiple individual arcs for different ion trajectories. For purposes of clarity, the following convention is adopted herein. An inner portion 122 of the arc 120 is made of those ion trajectories closer to the convex scanner portion 204 while the outer portion 124 of the arc is made of those ion trajectories closer to the concave scanner portion 202. Also shown in FIG. 1B are the projected scanner position 202A, and projected scanner position 204A, which represent the positions of the concave scanner portion 202 and convex scanner portion 204, respectively, when each are displaced along a direction parallel to Zs. Using this convention, the arc 120 bends toward the projected scanner position 204A and away from the projected scanner position 202A. As detailed below, the ions of ion beam 112 that travel along the inner portion 122 are subject to the combined effect of a local electric field adjacent a convex electrostatic scan plate (convex scanner portion 204) and a less convergent magnetic field applied by the magnetic collimator 108. The ions of ion beam 112 that travel along the outer portion 124 are subject to the combined effect of a local electric field adjacent a concave electrostatic scan plate (concave scanner portion 202) and a more convergent magnetic field applied by the magnetic collimator 108. These competing electric field and magnetic field effects are balanced in the present embodiments to reduce vertical divergence within the ion beam 112 as a whole.

Figure 2A:
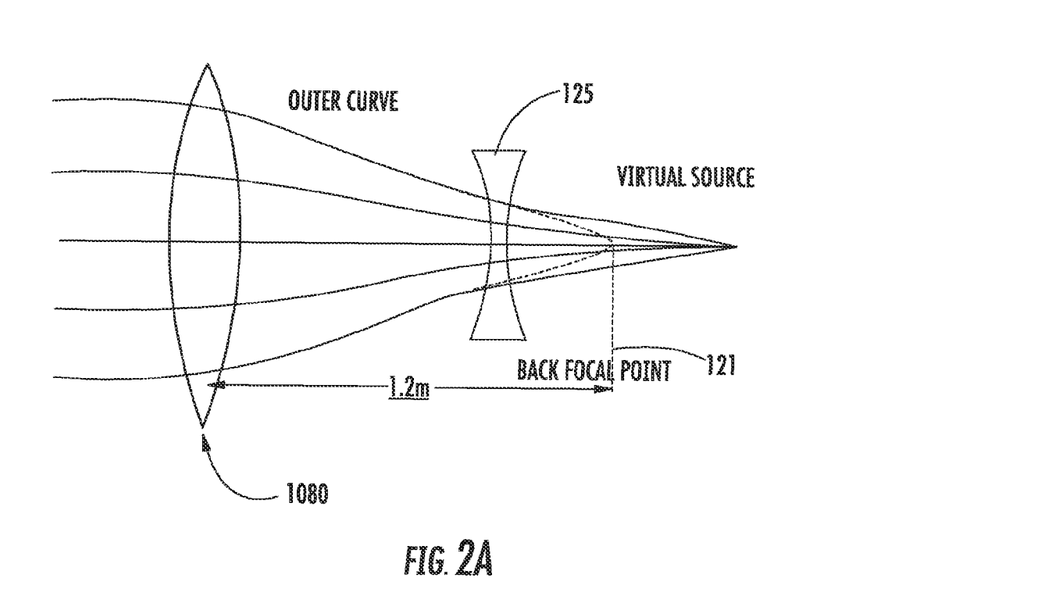
FIG. 2A depicts an optical component representation of manipulation of an outer curve portion of an ion beam according to the present embodiments.
Figure 2B:
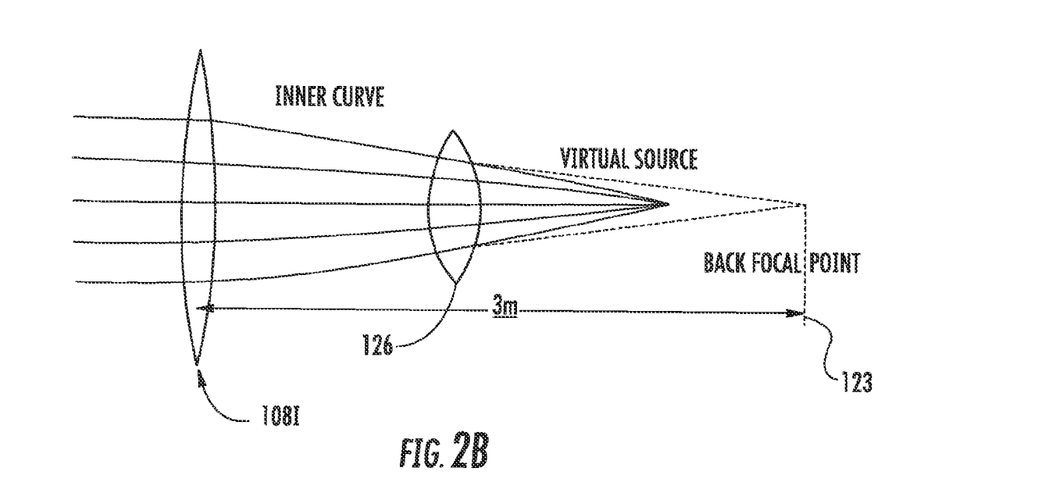
FIG. 2B depicts an optical component representation of manipulation of an inner curve portion of an ion beam according to the present embodiments.
Figure 3A:
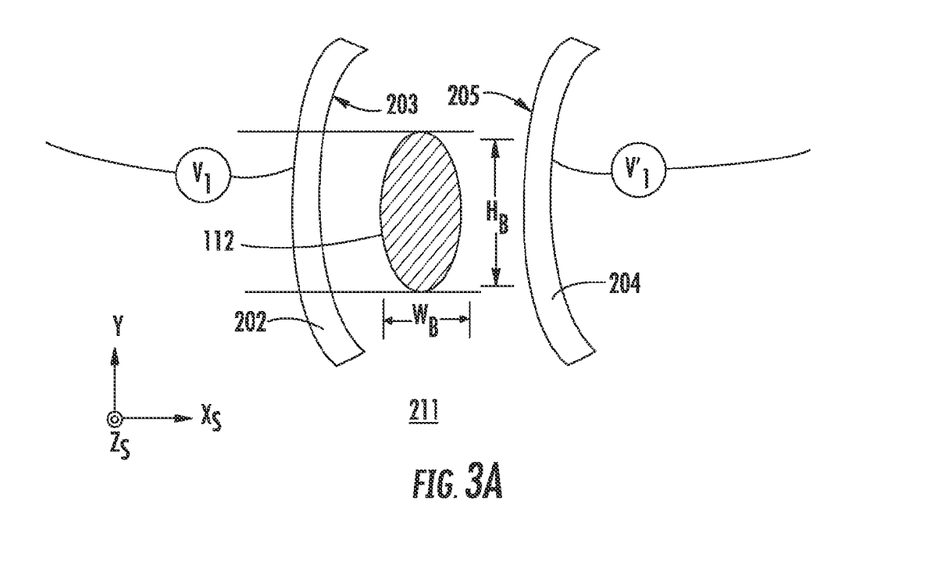
FIG. 3A depicts a front view of an embodiment of a electrostatic scanner.
Figure 3B:
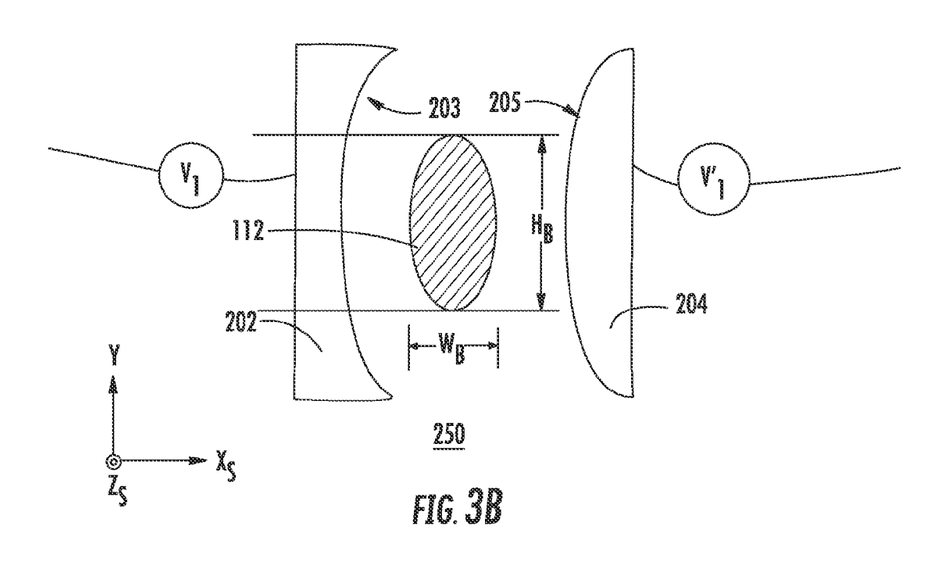
FIG. 3B illustrates a front view of another exemplary electrostatic scanner.
Figure 3C:
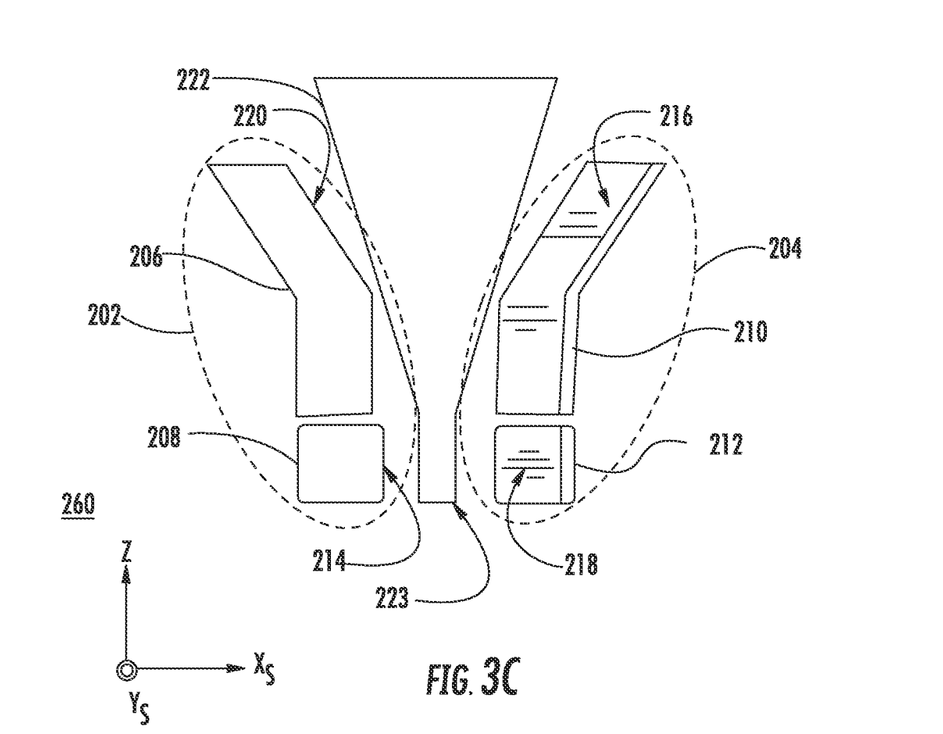
FIG. 3C depicts a isometric view of a electrostatic scanner according to the present embodiments.
Figure 3D:
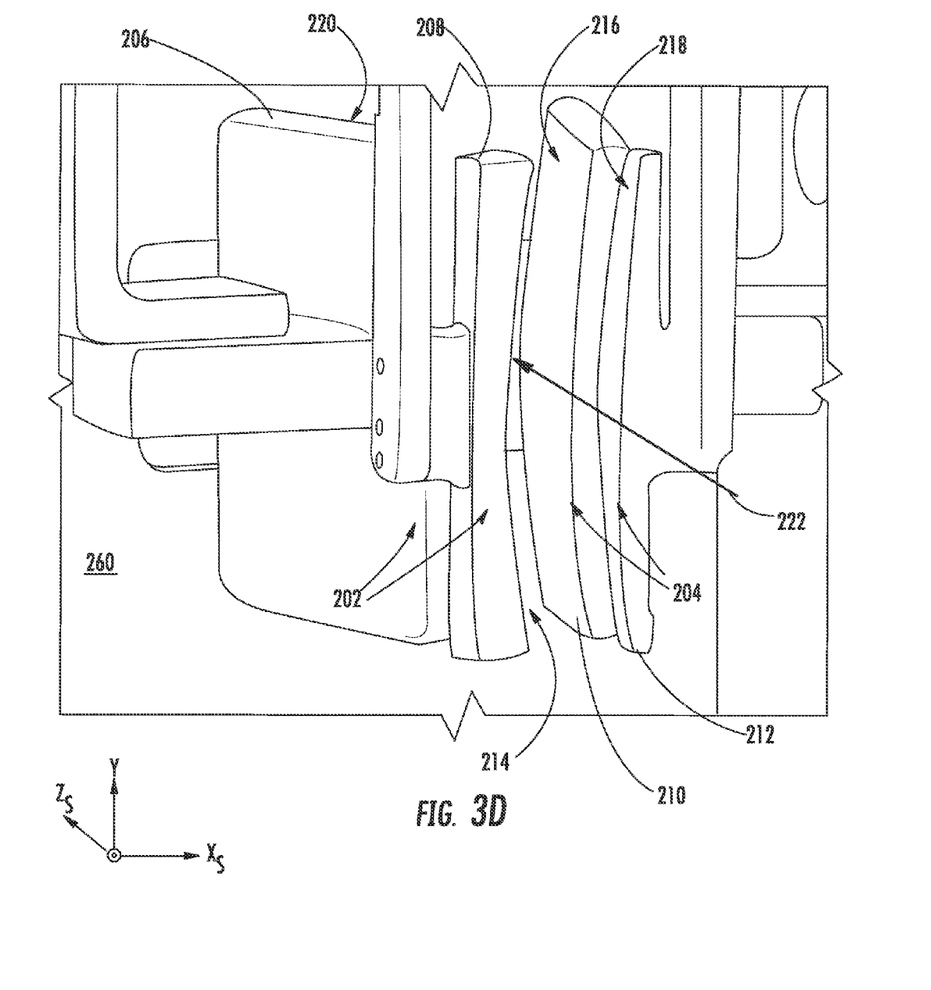
FIG. 3D depicts a top view of a electrostatic scanner according to the present embodiments.

Turning now to FIGS. 2A-2B, FIGS. 3A-3D, and FIGS. 4-5 there are shown detailed examples of curved scan plate apparatus and the control of ion beam properties afforded by such scan plates. Such curved scan plate apparatus are referred to as "electrostatic scanner" and perform functions of an electrostatic scanner to scan an ion beam, as well as to generate a varying vertical focus to the ion beam to compensate for the variable focus applied by a magnetic collimator. In particular, FIGS. 3C and 3D depict perspective and top views, respectively, of an electrostatic scanner, while FIGS. 3A, 3B, 4, and 5 depict front views of electrostatic scanners.

To highlight the effects of variable focusing of an ion beam, FIGS. 2A and 2B depict magnetic collimator 108 and electrostatic scanner 106 as a set of optical elements, showing their effect on ion beam focusing properties, and in particular the focusing in the vertical direction that lies parallel to the Y-direction shown in the figures.

In one example, the present inventors have analyzed properties of a known magnetic collimator as a function of position along the Xc direction. As shown in FIG. 2A, the outer curve portion 108O of the magnetic collimator corresponding to outer curve position O (see FIG. 1A) has a vertical focal length of about 1.2 m, as denoted by back focal plane 121, while the inner curve portion 108I corresponding to inner curve position I has a focal length of 3 m as denoted by back focal plane 123. In order to compensate for this variable focusing, a set of curved electrostatic plates are provided in electrostatic scanners of the present embodiments such as the electrostatic scanner 106. As noted above, the curved electrostatic plates (hereinafter referred to also as "scan plates") act to provide variable focusing to compensate for the variation in focusing of magnetic collimator between inside and outside curve. In one example, the curved electrostatic plates act to effectively provide a diverging lens 125 to compensate for outer curve portion focal length and a converging lens 126 to compensate for the inner curve portion focal length to ensure that vertical divergence of the ion beam is minimized across the ion beam.

In principle the compensation for variable vertical focusing of the ion beam produced by the magnetic collimator may be addressed in different ways. For example, a diverging lens may be placed downstream of a conventional electrostatic scanner toward outer curve portions of the ion beam, while a converging lens is placed toward inner curve portions of the ion beam. However, because the ion beam is rapidly scanned along the Xs direction during operation of an electrostatic scanner, the variation in vertical focusing is to be exactly synchronized with the scanning. It would be technically cumbersome to add another optical element to accomplish this synchronization, together with the required high voltage amplifier to drive the optical element at the same frequency and with the same waveform as that generated by thee scan plates of the electrostatic scanner. Another way of correcting for this variation in vertical focusing of the magnetic collimator is to design and implement a shaped pole piece collimating magnet to replace the conventional magnetic collimator design, using, for example, a so-called double (or triple) index design. This, however, would increase the size, cost and complexity of the magnet and would be impossible to retrofit to an existing ion implantation apparatus. Accordingly, the electrostatic scanners of the present embodiments having curved scan plates present an elegant and effective approach to minimizing vertical angle spread across a substrate for an ion beam.

Turning now to FIG. 3A there is shown an electrostatic scanner 211 which includes the concave scanner portion 202 and convex scanner portion 204. In this embodiment the concave scanner portion 202 and convex scanner portion 204 may each comprise a single plate that act as electrodes. The perspective of FIG. 3A is looking downstream in the direction of propagation along the Zs direction at the point of the electrostatic scanner 211. The ion beam 112 is defined by a beam height $H_B$ and beam width $W_B$ where $H_B$ is larger than $W_B$. A pair of voltage sources V1 and V1' are coupled to the concave scanner portion 202 and convex scanner portion 204, respectively, in which V1 delivers a voltage that is different from V1'. In some implementations the voltage sources V1 and V1' are applied as AC signals where V1 and V1' have different voltage values for most of an AC cycle. When the voltage values differ, an electric field is generated between the concave scanner portion 202 and convex scanner portion 204. The concave scanner portion 202 presents a concave inner surface 203 to the ion beam 112 in the Xs-Y plane, while the convex scanner portion 204 presents a convex inner surface 205 to the ion beam 112. The concave shape of the first inner surface, the concave inner surface 203 and the convex shape of the second inner surface, the convex inner surface 205, both may define a radial arc in the Xs-Y plane.

In particular implementations, the voltage values delivered by V1 and V1' may have a same magnitude and opposite polarity at any given instant, except when both are equal to zero. However, because concave scanner portion 202 presents a concave inner surface 203 and convex scanner portion 204 a convex inner surface 205 in the Xs-Y plane, the electric field generated is not symmetrical about the Y (vertical) direction. This leads to variable vertical focusing of the ion beam 112 as the beam is scanned back and forth between concave scanner portion 202 and convex scanner portion 204.

Although the embodiment of FIG. 3A illustrates scanner portions that are shaped as plates of constant thickness, in other embodiments concave and convex scanner portions may have other shapes. FIG. 3B illustrates another electrostatic scanner 250 in which the concave scanner portion 202 has a concave surface facing the ion beam 112, and the convex scanner portion 204 has a convex surface facing the ion beam 112 as in the embodiment of FIG. 3A. However, in this embodiment, the outer portions of the concave scanner portion 202 and convex scanner portion 204 are oriented parallel to the Y direction. Notably, the configurations of FIGS. 3A and 3B may both yield the same electric field given the same separation and same voltages applied to the respective concave and convex portions.

As noted previously, in some embodiments concave scanner portion 202 and convex scanner portion 204 may each include multiple scan plates. FIG. 3C depicts a top view of one variant of a electrostatic scanner 260, in which each of concave scanner portion 202 and convex scanner portion 204 includes a short scan plate and long scan plate. As shown, the concave scanner portion 202 includes a front scan plate 208 and back scan plate 206, which oppose front scan plate 212 and back scan plate 210, respectively, of the convex scanner portion 204. As further shown in FIG. 3C the shape of the electrostatic scanner 260 in the Xs-Z plane may be similar to that of conventional electrostatic scanners in which the electrodes (scan portions) flare out away from one another. Nevertheless, in some embodiments, the shape of the pair of front scan plate 208 and front scan plate 212 and that of the pair of back scan plate 206 and back scan plate 210 in the Xs-Y plane may be similar to that shown in FIG. 3B. Thus, the respective surfaces, surface 214 and surface 220 of front scan plate 208 and back scan plate 206 present a concave arc in the Xs-Y plane with respect to the ion beam 222, and the respective surfaces 218, 216 of the front scan plate 212 and back scan plate 210 and back scan plate 206 present a convex arc in the Xs-Y with respect to the ion beam 222.

In operation, in one example, a variable voltage may be applied between front scan plate 208 and front scan plate 212 while no voltage is applied to the back scan plate 206 and back scan plate 210. In particular, a voltage waveform may be applied between front scan plate 208 and front scan plate 212 as an AC signal in which the polarity varies between front scan plate 208 and front scan plate 212. This causes a varying deflection of an ion beam 222 passing through the gap 223 defined between front scan plate 208 and front scan plate 212. The ion beam 222 is rastered in particular in a horizontal direction, that is, along the Xs direction creating the shape for ion beam 222 shown as time averaged ion beam envelope in FIG. 3C. In another example, a variable voltage signal may be applied between front scan plate 208 and front scan plate 212 and simultaneously between the back scan plate 206 and back scan plate 210.

As noted previously, because an electric field generated by the concave scanner portion 202 and convex scanner portion 204 is not symmetrical about the Y-direction, as the ion beam 222 is scanned back and forth along the Xs direction the ion beam 222 is focused differently in the Y-direction when positioned nearer the convex scanner portion 204 as opposed to when positioned nearer the concave scanner portion 202.

Figure 4:
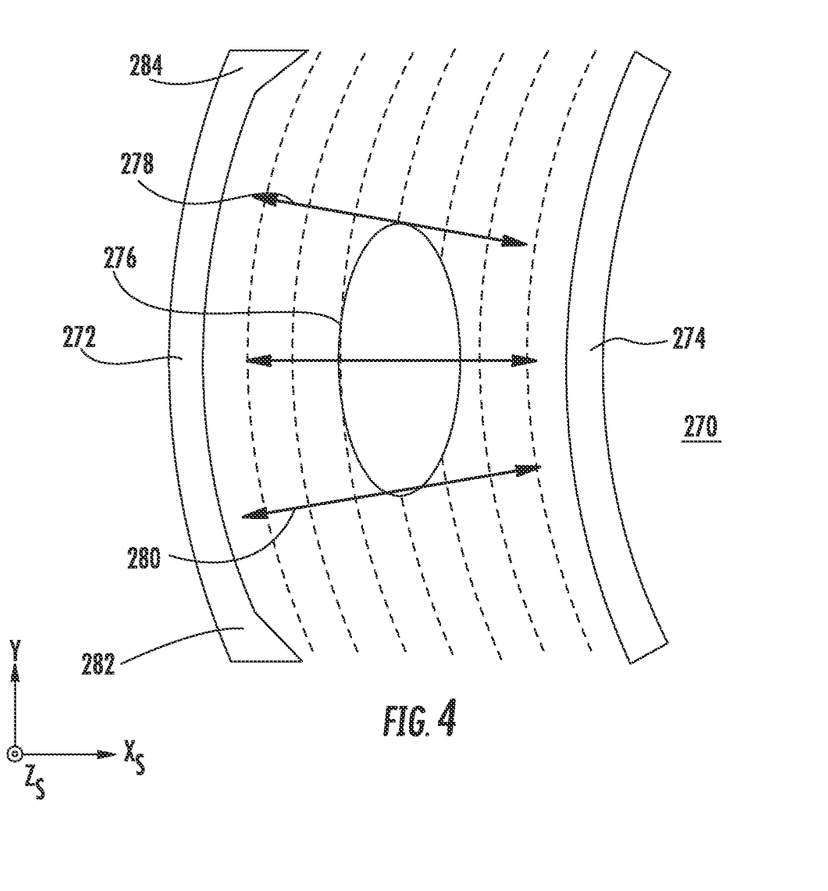
FIG. 4 depicts a front view of a further electrostatic scanner according to the present embodiments.

The origin of the variable vertical focusing provided by any of the aforementioned electrostatic scanners may be better understood with reference to FIG. 4, which presents another embodiment of an electrostatic scanner 270 facing downstream along the Zs direction. The electrostatic scanner 270 includes concave scanner portion 272 and convex scanner portion 274, which are disposed on opposite sides of the ion beam 276. In the instance shown n FIG. 4, the ion beam 276 is located approximately midway between the concave scanner portion 272 and convex scanner portion 274. The ion beam 276 is relatively tall along the Y-direction and narrow along the Xs direction. In operation the ion beam 276 experiences a varying electrostatic deflection field in which the electric field polarity may switch multiple times per second. The dotted lines are meant to suggest equipotential lines in which voltage is constant along any given line. In contrast to a conventional electrostatic scanner in which the direction of electric field may extend generally along the Xs direction, the arrows 278, 280 illustrate differing directions of the electric field at top and bottom portions of the ion beam 276, respectively. As illustrated, the electric filed in these portions is not parallel to the Xs direction but rather converges toward the convex scanner portion 204. As the ion beam is scanned back and forth along the Xs direction, the net effect of the electric field is to provide more vertically divergent focusing when the ion beam is located along an outer trajectory closer to the concave scanner portion 202 and vertically convergent focusing for an inner trajectory closer to the convex scanner portion 204.

Figure 5:
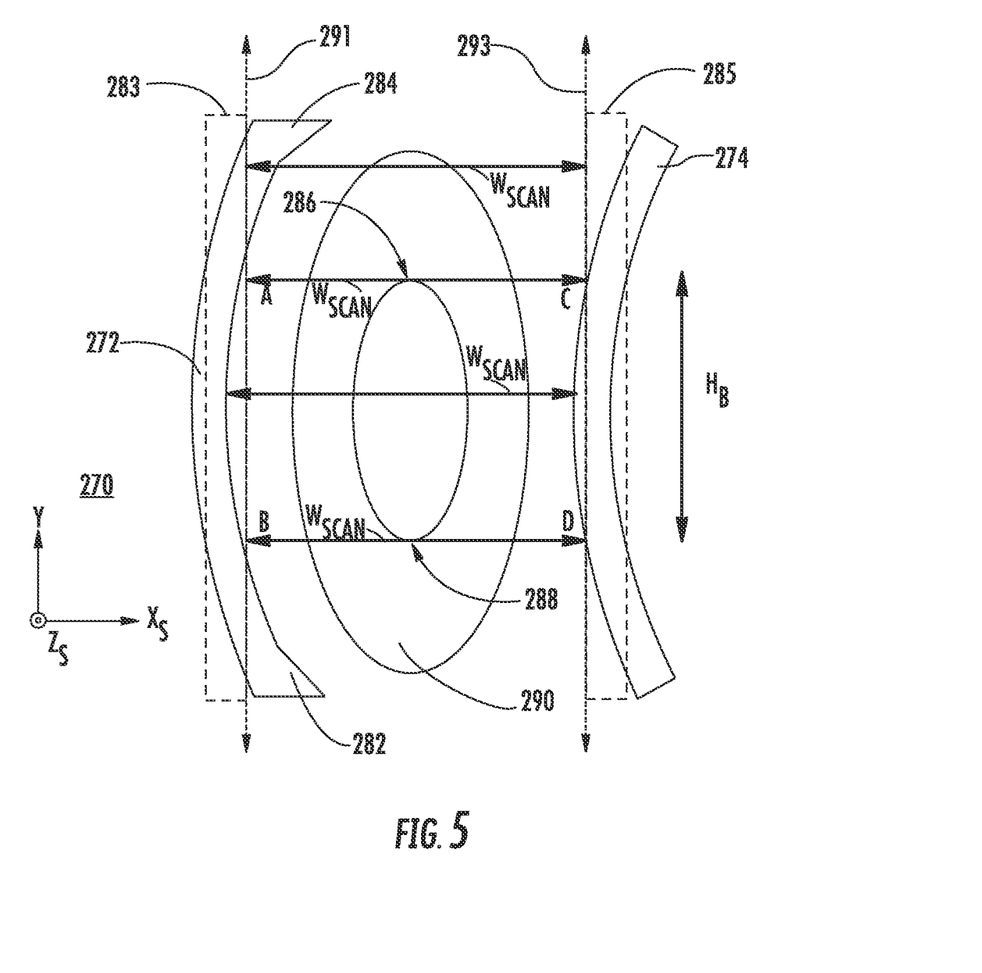
FIG. 5 depicts front view of an electrostatic scanner of the present embodiments superimposed on a conventional electrostatic scanner.

FIG. 5 also presents a view of electrostatic scanner 270 facing downstream along the Zs direction, in which a set of conventional scan plates is superimposed on the concave scanner portion 272 and convex scanner portion 274 of the electrostatic scanner 270. The conventional left scan plate 283 and conventional right scan plate 285 extend parallel to one another and the Y-direction. In this case, the electrostatic field generated by the conventional scan plates lies along the Xs direction. Such a conventional electrostatic field does not compensate for variable vertical focusing produced by a collimator magnet, such as the magnetic collimator 108, as discussed above. In contrast, the curved electrostatic scan plate configuration provided by concave scanner portion 272 and convex scanner portion 274 may provide variable vertical focusing in exact synchronicity with the ion beam deflection generated during scanning of the ion beam 276. Thus, whenever the ion beam 276 is proximate the concave scanner portion 272, corresponding to an outer curve position O (see FIG. 1), the electrostatic field generated between the concave scanner portion 272 and convex scanner portion 274 provides the appropriate vertical focusing to compensate for any vertical angle spread that would otherwise be produced the magnetic collimator 108 at the outer curve position O. When the ion beam 276 is proximate the convex scanner portion 274, corresponding to an inner curve position I, the electrostatic field generated between the concave scanner portion 272 and convex scanner portion 274 provides the appropriate vertical focusing to compensate for any vertical angle spread that would otherwise be produced the magnetic collimator 108 at the inner curve position I. It is to be noted that the general shape of the concave scanner portion 272 and convex scanner portion 274 illustrated in FIGS. 4 and 5 may represent a cross-section of any pair of opposed scan plates, such as front scan plate 208 and front scan plate 212 in one example, or back scan plate 206 and back scan plate 210 in another example. Of course the absolute separation along the Xs direction between convex and concave scan plates may be greater in the case of the back scan plate 206 and back scan plate 210 as shown from the top view of FIG. 3C.

In various embodiments the size and shape of the scan portions of an electrostatic scanner is tailored to the ion beam size for ion beams generated in a given ion implantation system. For example, a given beamline apparatus may be configured to generate ion beams having an optimal beam height which is shown as $H_B$ in FIG. 5 when passing through the electrostatic scanner 270. As illustrated in FIG. 5, the concave scanner portion 272 and convex scanner portion 274 may be separated by a constant horizontal separation $W_{B\backslash SCAN}$ that is the same as the separation for a conventional arrangement illustrated by the conventional left scan plate 283 and conventional right scan plate 285. This facilitates the ability to generate the same electrostatic field strength for a given applied voltage in the electrostatic scanner 270 as in a conventional scanner having a same separation of scanner electrodes (plates) as the separation $W_{SCAN}$.

In order to properly apply a variable vertical focusing to such an ion beam 276, it may therefore be desirable to arrange concave and convex scanner portions to define a set of upper and lower inflection points in which the inner surfaces of the concave scanner portion 272 and convex scanner portion 274 coincide with the inner surfaces of their conventional scan plate counterparts, that is, conventional left scan plate 283 and conventional right scan plate 285. This situation is illustrated in FIG. 5 which shows the set of inflection points A, B, C, D in which points A and C on the one hand, and points B and D on the other hand are separated by the distance $W_{SCAN}$, shown by vertical line 291 and vertical line 293, which distance is the same as the constant separation of conventional left scan plate 283 conventional right scan plate 285. Moreover, the inflection points A and B overlap (in the Xs-Y plane) the inner surface of conventional left scan plate 283, while the inflection points C and D overlap (in the Xs-Y plane) the inner surface of conventional right scan plate 285. As further shown in FIG. 5, the inflection points A and C are aligned approximately with the position of the top 286 of the ion beam 276, and the inflection points B and D are aligned approximately with the position of the bottom 288 of the ion beam 276. In this configuration, the separation of the concave scanner portion 272 and convex scanner portion 274 are such that the ion beam 276 is properly shaped by the electric fields generated therebetween. In particular, the electric field strength is the same as that of the conventional arrangement defined by conventional scan left scan plate 283 and conventional right scan plate 285. Moreover, the ion beam 276 is not substantially more likely to clip edges of the concave scanner portion 272 and convex scanner portion 274 when rastered back and forth in comparison to a conventional electrostatic scan plate arrangement provided by the conventional scan left scan plate 283 and conventional right scan plate 285. Even when an ion beam 290 is generated having a larger size than standard, the ion beam 290 may be prevented from striking the bevel features 282, 284 using the configuration shown in FIG. 5.

In some embodiments, both concave and convex portions of an electrostatic scanner may have a shape of a circular arc in the Xs-Y plane. However, in other embodiments, in order to compensate for the finite size of scan plates along the Y-direction, higher order features may be provided, in particular within the concave scan plates. This compensates for aberration that may be generated because of the limited height of the scan plates along the Y direction in comparison to the ion beam height. The higher order shapes may effectively provide enhanced curvature at the opposite ends of concave scan plates as shown by the bevel features 282, 284.

In various embodiments the concave shape of a first inner surface of a scan plate may define an arc having a first curvature in a central portion and a second curvature that is greater than the first curvature on end portions of the arc. As exemplified in the electrostatic scanner 270, the enhanced curvature effectively reduces the value of distance $W_{SCAN}$ at the extreme upper or lower portions of the electrostatic scanner 270. In other embodiments enhanced curvature towards upper and lower ends of scan plates may be provided by creating a parabolic shape for scan plates in the Xs-Y plane. In still further embodiments, the scan plates may have a shape defined by a higher order polynomial that is optimized to reduce aberration and other non-ideal beam features.

In summary, the present embodiments provide a novel electrostatic scanner to reduce vertical angle spread for ion beams generated by conventional apparatus. The present embodiments, by providing curved scanner portions that are composed of electrostatic scan plates, adjust for the variable vertical focusing produced by conventional magnetic collimators. Consistent with the present embodiments, the exact shape of scan plates may be tailored according to the variable vertical focusing provided by a magnetic collimator. Thus, a magnetic collimator that generates a relatively greater change in vertical focusing of an ion beam between inner and outer regions of an arc may be coupled with a set of scan plates that generate a relatively larger change in vertical focusing as the ion beam is deflected between a convex scan plate and concave scan plate.

The reduction of vertical angle spread in particular is achieved across a substrate or wafer such that the vertical angle spread is uniform along the scan direction (Xs or Xc) and is generally much less than that found in certain portions of a conventionally manipulated ion beam. In some embodiments a vertical angle spread of ions the inner portion and outer portion of an arc through which the ion beam by a magnetic collimator is bent before delivery to a substrate is less than 0.2 degrees.

This may help enable precise location of dopants within three dimensional device structures that have aspect ratios that present challenges given the angular ion spread for existing ion implantation apparatus. Moreover, this ability to reduce vertical angle spread of an ion beam across a substrate may be especially important for applications in which implantation is deliberately conducted along channeling directions. In the latter cases, even small variations in vertical angle spread of implanting ions may result in substantial changes in implant depth and thereby substantial changes in device properties across a substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An electrostatic scanner to scan an ion beam in an ion implanter, comprising:
   a first scan plate having a first inner surface that faces the ion beam, the first inner surface having a concave shape in a first plane that is perpendicular to a direction of propagation of the ion beam; and
   a second scan plate opposite the first scan plate separated by a gap to accept the ion beam the second scan plate having a second inner surface that faces the ion beam and a convex shape in the first plane, the first scan plate and second scan plate configured to generate an electrostatic field in the gap to scan the ion beam back and forth along a horizontal direction perpendicular to the direction of propagation of the ion beam.

2. The electrostatic scanner of claim 1, wherein the concave shape of the first inner surface and the convex shape of the second inner surface both define a radial arc in the first plane.

3. The electrostatic scanner of claim 1, wherein the concave shape of the first inner surface defines an arc having a first curvature in a central portion and a second curvature that is greater than the first curvature on end portions of the arc.

4. The electrostatic scanner of claim 1, wherein the concave shape of the first inner surface and the convex shape of the second inner surface each have a parabolic shape in the first plane.

5. The electrostatic scanner of claim 1, wherein the first scan plate and the second scan plate are interoperative to:
   generate a first vertical focusing of the ion beam in a vertical direction that is perpendicular to the horizontal direction and perpendicular to the direction of propagation of the ion beam when the ion beam is proximate the first scan plate; and
   generate a second vertical focusing of the ion beam in the vertical direction when the ion beam is proximate the second scan plate,
   the first vertical focusing being more divergent than the second vertical focusing.

6. The electrostatic scanner of claim 1, wherein vertical focusing of the ion beam varies continuously as the ion beam is scanned back and forth between the first scan plate and second scan plate.

7. An ion implantation system, comprising:
   an electrostatic scanner to scan an ion beam, comprising:
      a first scan plate;
      a second scan plate opposite the first scan plate;
      the first scan plate and second scan plate separated by a gap to conduct the ion beam therethrough, and configured to generate an electrostatic field therebetween; and
   a magnetic collimator operative to bend the ion beam in a curve within a first plane,
   wherein the curve comprises an outer curve portion and an inner curve portion,
   wherein the first scan plate and second scan plate are interoperative to generate variable vertical focusing of the ion beam along a vertical direction that is perpendicular to the first plane, and wherein vertical focusing is more divergent along the outer curve portion than the inner curve portion.

8. The ion implantation system of claim 7,
   wherein the first scan plate has a first inner surface that faces the ion beam and has a concave shape in a first plane that is perpendicular to a direction of propagation of the ion beam; and
   wherein the second scan plate has a second inner surface that faces the ion beam and has a convex shape in the first plane.

9. The ion implantation system of claim 8, wherein the concave shape defines an arc having a first curvature in a central portion and exhibiting a second curvature that is greater than the first curvature on end portions of the arc.

10. The ion implantation system of claim 7, wherein the first scan plate and the second scan plate are interoperative to:
    generate a first vertical focusing of the ion beam along the vertical direction when the ion beam is proximate the first scan plate; and
    generate a second vertical focusing of the ion beam along the vertical direction when the ion beam is proximate the second scan plate,
    the first vertical focusing being more divergent than the second vertical focusing.

11. The ion implantation system of claim 7, wherein vertical focusing of the ion beam varies continuously as the ion beam is scanned back and forth between the first scan plate and second scan plate.

12. The ion implantation system of claim 7, further comprising a mass analysis slit configured to deliver the ion beam to the electrostatic scanner with a beam height in the vertical direction, the vertical direction being perpendicular to direction of propagation of the ion beam,
    the first and second scan plates defining a horizontal separation therebetween along a horizontal direction perpendicular to the vertical direction, wherein the first and second scan plates each have first and second inflection points that are separated by a distance equal to the beam height and intersect respective first and second vertical lines that are spaced by the horizontal separation and are parallel to the vertical direction.

13. The ion implantation system of claim 7, wherein the magnetic collimator is configured to deliver the ion beam to a substrate having a vertical focus along the inner curve portion equal to that along an outer curve portion, the vertical focus lies along the vertical direction, and wherein a vertical angle spread of ions the inner portion and outer portion of the curve are less than 0.2 degrees.

14. A method for processing an ion beam, comprising:
    directing the ion beam between a first scan plate having a concave curvature on an inner surface facing the ion beam and a second scan plate having a convex curvature on an inner surface facing the ion beam and the first scan plate, the concave curvature and convex curvature lying in a first plane; and
    scanning the ion beam back and forth using a fluctuating electric field between the first scan plate and second scan plate in a horizontal direction perpendicular to a direction of propagation of the ion beam.

15. The method of claim 14, wherein when the ion beam is proximate the first scan plate the fluctuating electric field generates a first vertical focusing of the ion beam in a vertical direction perpendicular to the horizontal direction and perpendicular to the direction of propagation of the ion beam, and generates a second vertical focusing of the ion beam in the vertical direction when the ion beam is proximate the second scan plate, the first vertical focusing being more divergent than the second vertical focusing.

16. The method of claim 14, further comprising bending the ion beam using a magnetic field through a curve away from a projected scanner position of the first scan plate and toward a projected scanner position of the second scan plate, the curve lying within a second plane perpendicular to the first plane, wherein the magnetic field generates a variable vertical focusing of the ion beam across the curve, and wherein a vertical angle spread of ions exiting the magnetic field on an inner curve portion of the curve and along an outer curve portion of the curve are each less than 0.2 degrees.

17. The method of claim 16, comprising varying vertical focusing of the ion beam in a vertical direction that is perpendicular to the horizontal direction and perpendicular to direction of propagation of the ion beam as the ion beam is scanned back and forth between the first scan plate and second scan plate.

* * * * *